United States Patent
Labrum et al.

[11] Patent Number: 4,722,596
[45] Date of Patent: Feb. 2, 1988

[54] ACOUSTO-OPTIC ANALYZER WITH DYNAMIC SIGNAL COMPRESSION

[75] Inventors: Joseph H. Labrum, West Jordan, Utah; F. Avery Bishop, Acton, Mass.

[73] Assignee: Sperry Corporation, Blue Bell, Pa.

[21] Appl. No.: 862,691

[22] Filed: May 13, 1986

[51] Int. Cl.⁴ .................. G02F 1/11; G02F 1/33; G01R 23/16; G01R 27/02
[52] U.S. Cl. .................. 350/358; 350/371; 350/372; 324/77 K
[58] Field of Search ............... 350/358, 372, 401, 400, 350/371; 364/822; 324/77 K

[56] References Cited

U.S. PATENT DOCUMENTS

| | | | |
|---|---|---|---|
| 3,942,109 | 3/1976 | Crumly et al. | 324/77 K |
| 4,126,834 | 11/1978 | Coppock | 350/358 |
| 4,530,573 | 7/1985 | Wolkstein | 350/358 |
| 4,602,342 | 7/1986 | Gottlieb et al. | 350/358 |
| 4,629,879 | 12/1986 | Baldwin et al. | 324/77 K |
| 4,639,092 | 1/1987 | Gottlieb et al. | 350/358 |

*Primary Examiner*—Eugene R. LaRoche
*Assistant Examiner*—Michael B. Shingleton
*Attorney, Agent, or Firm*—G. Donald Weber, Jr.; Glenn W. Bowen; Laurence J. Marhoefer

[57] ABSTRACT

An acousto-optic spectrum analyzer in which the dynamic range is effectively extended by detecting the frequency bands wherein the photo-detectors are saturated and providing a filter to suppress those frequencies. With this pre-filter, the entire spectrum appears to be within the dynamic range of the photo detectors. The actual spectrum can be reconstructed using the response of the suppression filter and the photo detector output.

22 Claims, 7 Drawing Figures

ACOUSTO-OPTIC ANALYZER WITH DYNAMIC SIGNAL COMPRESSION

GOVERNMENT RIGHTS

The U.S. Government may have rights in this invention in accordance with the terms and conditions of Contract No. F30602-84-C-0089 with the U.S. Department of Air Force.

BACKGROUND

1. Field of the Invention

This invention is directed to acousto-optic devices, in general, and to acousto-optic spectrum analyzers which exhibit an extended dynamic range, in particular.

2. Prior Art

Acousto-optic (AO) spectrum analyzers are known in the art. A typical analyzer is shown and described in, inter alia, the copending application entitled ACOUSTO-OPTIC R-F FILTER WHICH IS TUNABLE AND HAS ADJUSTABLE BANDWIDTH, bearing U.S. Ser. No. 06/566,437, now abandoned by J. H. Labrum, filed on Dec. 28, 1983 and assigned to the common assignee. This apparatus and operation is well known in the prior art wherein a detailed description thereof is deemed unnecessary. This type of analyzer has many advantages over conventional spectrum analysis techniques. The major drawback of the AO spectrum analyzers which are currently known is that dynamic range of operation is limited to around 30–35 dB. Typically, the lower end of the dynamic range is determined by the "dark" current caused by reverse leakage through the photodetector diodes, while the high end is limited by photodetector saturation.

This is a severe limitation in the standard acousto-optic spectrum analyzers known in the art. It is desirable to have a photo-detector array with an extended dynamic range processing capability of the acousto-optic spectrum analyzer which can handle signals that have a dynamic range on the order of 60 or 70 dB. That is, the dark current limit is substantially fixed and not subject to variation. Thus, the upper range limit must be addressed in order to improve operation. However, with the existing components, it is impossible to achieve the improved operation utilizing of the known architecture in the standard acousto-optic processor.

The dynamic range of the photo-detector array is, by far, the single weak link in solving the instantaneous dynamic range problem. There are presently two definitions of "dynamic range" in common use and one must know which definition is being used before placing any significance on the numbers. The first definition is:

$$DR = 20 \, \text{Log} \, (V_{max}/V_{min}) \tag{EQ-1}$$

where:
Vmax is the detector output saturation voltage and
Vmin is the detector output noise voltage.
The second definition is:

$$DR = 10 \, \text{Log} \, (V_{max}/V_{min}) \tag{EQ-2}$$

Where:
Vmax is the detector output saturation voltage and
Vmin is the detector output noise voltage.

Both equations use the same data but (EQ-1) yields twice the dynamic range of (EQ-2). In electronics, by definition, the first (EQ-1) equation is correct. However, because of the unique parameter being measured (optical power, not electrical power), the use of this equation yields the wrong result. In most applications, the photo-detector is an optical power-to-voltage converter. Thus, changing the optical input power by a factor of 10 results in an output voltage change of 10 times. Using equation (EQ-1) indicates a change of 20 dB when in fact the input optical power has only changed by 10 dB. The problem is really one of semantics, i.e., should one be measuring changes in the photodetector output voltage or the optical power input to the detector? All references to the dynamic range of the detector in this description will be based on the use of (EQ-2). It is important to be aware of which equation is used in other publications before making any direct number comparisons.

SUMMARY OF THE INVENTION

A technique and apparatus is described for extending the dynamic range of an acousto-optic analyzer by pre-filtering the input signal. This technique and apparatus detects locations in the spectrum where the photodetectors are saturated. A microprocessor then designs a pre-filter to suppress the high amplitude frequency components of the input signal so that the filtered spectrum fits within the dynamic range limitations of the optical spectrum analyzer. The actual spectrum can then be reconstructed from the compressed spectrum and the frequency response of the pre-filter. The pre-filter can be fixed, variable or iterative.

DESCRIPTION OF PREFERRED EMBODIMENTS

Figure 1:
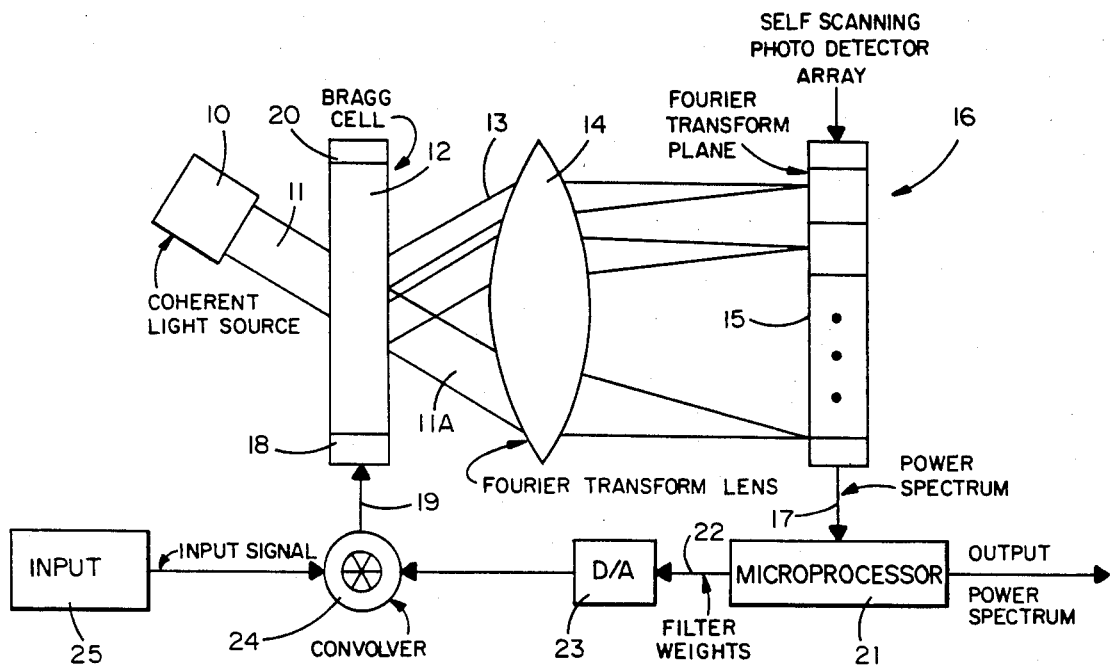
FIG. 1 is a block diagram of one embodiment of the system of the instant invention.

Referring now to FIG. 1, there is shown a schematic diagram of a preferred embodiment of the instant invention. In this Figure, a suitable source 10 of optical radiation is provided. Typically, source 10 is a coherent light source, such as a laser or the like, and provides a coherent, collimated light beam 11.

The light beam 11 is supplied to a Bragg cell 12 of conventional design. The Bragg cell causes the light beam 11 to be appropriately diffracted in accordance with the frequency of the input signal described hereinafter.

The diffracted beams 13 (and the undiffracted beam 11A) are supplied to a Fourier transform lens 14 which operates to focus the several light beams at a prescribed distance which is referred to as the Fourier transform plane 15.

A self-scanning photodetector array 16 is disposed at the Fourier transform plane 15 and is adapted to selectively receive the light beams from the lens 14. The array comprises, typically, a plurality of photodetectors and is conventional in the art. The detector array 16 produces output signals which are a function of the light beams which are detected at the respective detectors. These output signals are referred to as a power spectrum and are divided on output line 17.

This arrangement of the invention is substantially conventional and similar to devices described in the prior art as noted above. Consequently, a detailed description of all the components is believed unnecessary. For example, the Bragg cell 12 includes a transducer 18 at one end thereof which is connected to receive input signals along line 19. Likewise, the Bragg cell 12 may include absorbing material 20 at the opposite end thereof. However, this cell construction forms no portion of the invention, per se, and is not described in detail in order to avoid unnecessary complication of the invention description.

However, in accordance with this invention, the output line 17 from detector array 16 is connected to a microprocessor 21 of conventional design. This microprocessor comprises various components including memory devices such as a read only memory (ROM), a random access memory (RAM), and the like. Likewise, the microprocessor 21 can include appropriate software so that it will perform suitable functions (such as an FFT or the Hamming function) on the signals supplied thereto on line 17. Appropriate signals are then produced at one output of the microprocessor 21 and are referred to as the filter weight signals. These filter signals are applied along line 22 to a digital-to-analog converter 23. The D/A converter 23 provides signals to a convolver 24. Convolver 24 is, in the preferred embodiment described in FIG. 1, an analog signal convolver.

The input source 25, which can be any suitable source such as an antenna or the like, provides the input signals which are supplied to another input terminal of convolver 24. The output from convolver 24 is supplied to the transducer input 18 at Bragg cell 12.

The specifics of the input signal source 25 are not described in detail inasmuch as this is also conventional apparatus and technique.

Thus, this invention comprises a hybrid electronic and optical system to pre-filter the incoming signal and suppress those frequency components which have high amplitude. This operates to reduce the dynamic range of the input signals to a range that can be processed by a standard optical signal processing spectrum analyzer.

Figure 2:
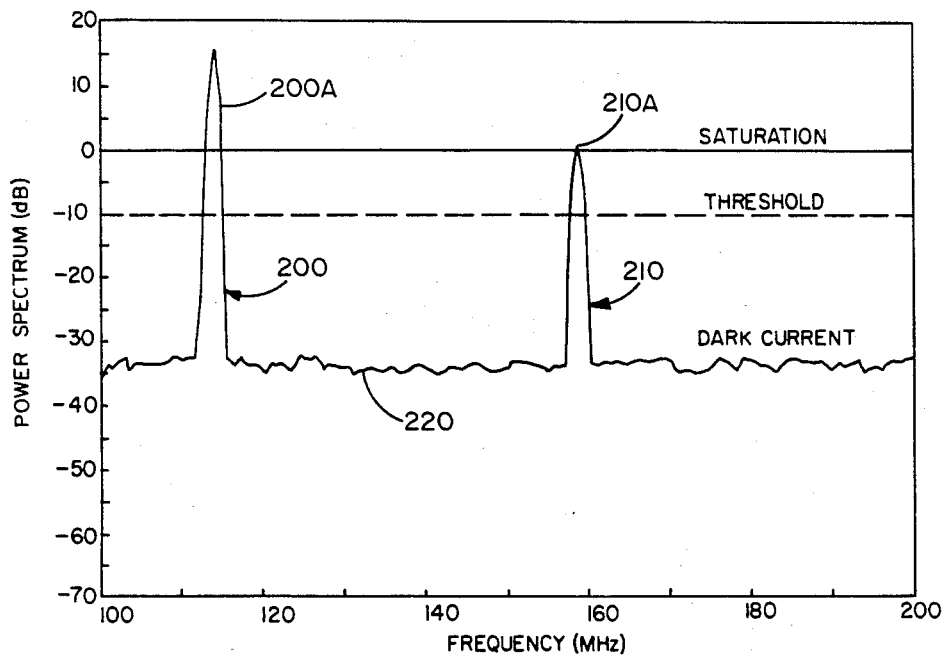
FIG. 2 is a graphic representation of an unfiltered power spectrum developed by the system shown in FIG. 1.

In operation, the photodetector array 16 supplies a power spectrum as its output signal on line 17 to microprocessor 21. A typical power spectrum is shown in FIG. 2. The microprocessor 21 examines the output signals and determines which, if any, photo-detectors are saturated. Saturation is detected when the signal is clipped. That is, the signal cannot go any higher than the photodetector saturation limit which is known. Thus, it is possible to calibrate the photodetector array when installed in the system and for each individual photodetector array saturation. Thus, when the signal voltage reaches that level, it is in saturation and attenuation is required. How much attenuation is required can be determined only by the arbitrary decision described herein. This decision is performed in the microprocessor. Clearly, a signal which is in saturation loses informational value. Thus, upon detection of an array signal of very high amplitude, (i.e., beyond saturation) it is necessary to reduce the signal amplitude. At this point the microprocessor generates a desired filter response and function, calculates the inverse Fourier transform and processes this transform into a set of filter weights. These weight signals are converted to analog signals by D/A converter 23 and applied to convolver 24 where the transform signal is convolved with the incoming signal. The convolving operation produces a selective filter which suppresses certain high amplitude signals supplied at input 25. This suppression reduces the amplitude of those high frequency and high amplitude signals to a range which is compatible with the standard optical spectrum analyzer that has a dynamic range on the order of 30-35 dB even though the incoming signal from source 25 may have a dynamic range of 70 dB.

In this embodiment, the analog convolver 24 is, preferrably, an optical component. Typical optical analog convolvers are described in "Acousto-Optic Signal Processing: Convolution and Correlation"; Rhodes; *Proc. IEEE*, Vol. 69, No. 1, June 1981 and "Signal Processing with a SAW Convolver/Amplifier"; Solie et al; *MICROWAVE JOURNAL*, pp. 48–50, May 1975.

In essence, the outputs from the photodetector array 16 are sensed and the microprocessor 21 detects when one (or more) detector in the array is in saturation. A typical power spectrum is graphically illustrated in FIG. 2. This spectrum includes examples of saturated conditions. However it is understood that the actual signal output from the photodetector array 16 cannot exceed the saturation amplitude level represented by the level 0 in FIG. 2. For example, the output signals 200 and 210 have the peaks 200A and 210A that are saturated. The microprocessor determines that one or more photodetector elements in array 16 are saturated at this amplitude. However, the microprocessor cannot determine the extent by which the photodetector is saturated.

In one embodiment of the invention, the microprocessor 21 generates a filter that will attenuate the output signal 17 by an arbitrary amount, for example 6 dB. The inverse Fourier transform of the attenuated output signal is then convolved with the incoming signal 25. The convolved signal 19 is applied to cell 12. The system then produces a "new" output signal 17. The new output signal is sensed to see if it is still saturated. If it is still saturated, the operation is repeated whereupon the amplitude of the attenuation relative to the saturation signal is changed. Eventually, an output signal 17 is produced which has been attenuated sufficiently so that the signal is completely below the saturation threshold. Clearly, the output signal no longer has the hard clip that exists at the original amplitude.

Figure 3:
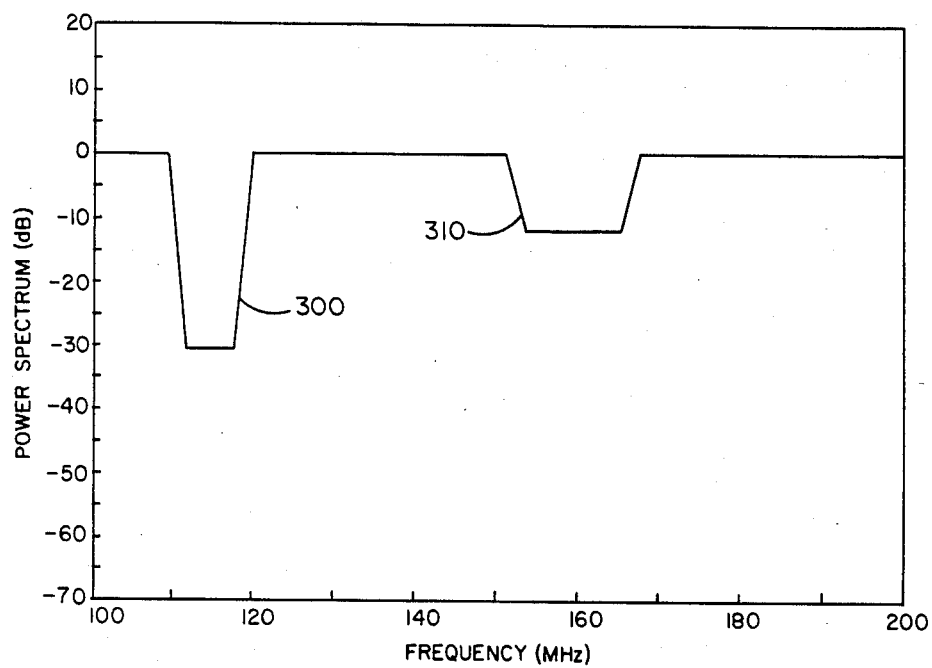
FIG. 3 is a graphic representation of one type of filter produced in accordance with the instant invention.

When this filter operation is concluded, a filter shape, shown idealized in FIG. 3 is produced. In this filter, notch 300 attenuates the frequency represented by signal 200 by about 30 dB. Likewise, notch 310 attenuates the frequency represented by signal 210, but by a different amount, for example 12 dB.

By taking the inverse transform of this filter and convolving it with the incoming signal from source 25, an adaptive filter operation is produced. While this arrangement is akin to operation of the electronic adaptive filters known in the art, the instant device is implemented in optical components rather than in electronic components and can handle much higher frequencies.

Typically, the frequency capability can easily be up to a gigahertz while the electronic filter is usually limited to a few hundred kilohertz.

However, the system operates most effectively when the in-coming signal is relatively fast, but a repetitive pattern or CW. On the other hand, the system is less effective in operating with very fast, short pulses such as radar pulses or a fast frequency hopper, e.g. faster than about 10,000 hops per second. However, the short-pulse information does not produce problems in the optical processor. Rather, difficulties can be encountered with the high amplitude, narrow band CW signals, such as jammers or radio stations which are relatively stationary for long periods of time, e.g. FM, AM, short wave broadcasters, or any application wherein a saturated situation is caused by a high amplitude interfering signal.

This first technique is referred to as filter design by iterative inverse Fourier transforming and computes an ideal magnitude response for the pre-filter. This ideal filter has a magnitude of zero dB at all frequencies within the band except where saturation has occurred. These saturation regions represent frequencies requiring suppression and are, thus, labeled suppression bands. As discussed, the response of the suppression bands is initially set at −6 dB (or some other magnitude). An inverse discrete Fourier transform (DFT) is then performed on this ideal magnitude filter response. The resulting discrete time waveform is shifted to make the filter casual, and multiplied in the microprocessor, for example, by the Hamming window to reduce sidelobes. These filter weights are converted to analog by D/A converter 23 as shown in FIG. 1 and convolved with the incoming waveform 25.

The output of the optical spectrum analyzer is then re-examined by the microprocessor to see if the power spectrum is now within the 30 dB dynamic range limit of the photodetectors. If so, this pre-filter is used until saturation again occurs. If not, a new pre-filter is designed wherein the filter magnitude response of the remaining suppression bands is reduced to −12 dB. This new ideal filter response is processed by inverse Fourier transforming, shifting, windowing, D/A converting, and the results again re-examined by the microprocessor. This process is repeated increasing the suppression in each saturation band by −6 dB for each iteration, until the filtered spectrum is within the 30 dB dynamic range limit of the photodetector array. This method requires a inverse discrete Fourier transform (DFT) at each iteration of the pre-filter design until all saturation regions are within the dynamic range of the optical spectrum analyzer.

Figure 4:
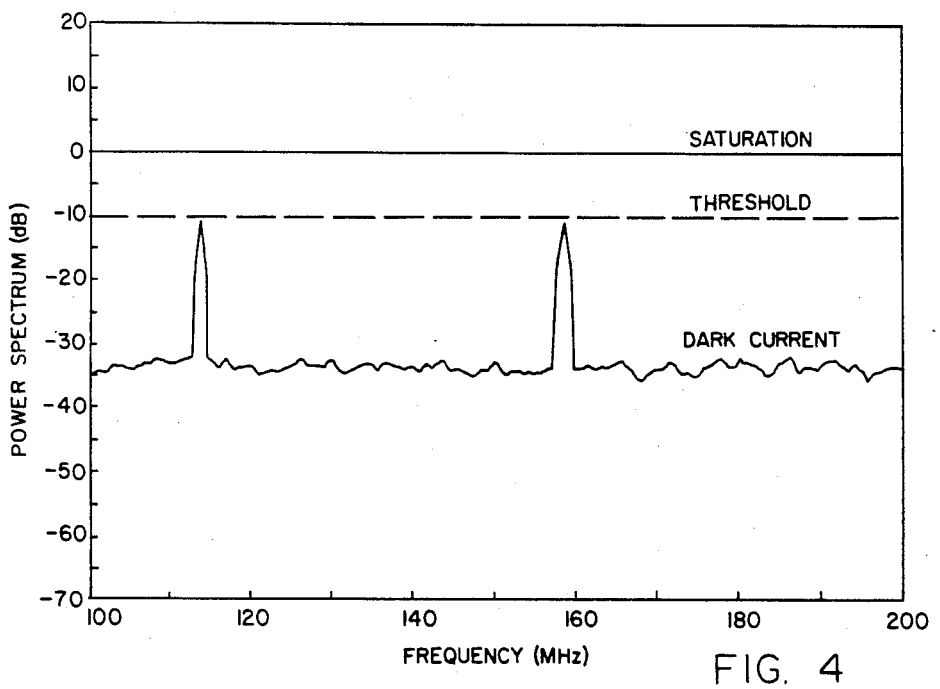
FIG. 4 is a graphic representation of the power spectrum shown in FIG. 2 after supression by the filter shown in FIG. 3.

A typical example of the operation is illustrated. For example, FIG. 2 shows a typical power spectrum with saturation levels. In particular, the spectrum saturates the photodetector in two places (peaks 200 and 210). The spectrum is suppressed in steps of −6 dB at these two points until both are below the threshold, as seen in FIG. 4. The final filter in FIG. 3 shows that the 158 MHz signal (peak 210) required only 12 dB of suppression while the 117 MHz (peak 200) signal required approximately 30 dB for all of the signals to be below the threshold level.

The second pre-filter design method is referred to as the iterative filter design from a single transform and performs one inverse transform of an ideal magnitude pre-filter response consisting of passbands about each of the saturation regions. A fraction of the resulting discrete time waveform is subtracted from an impulse to produce a suppression filter. After shifting, windowing, and converting to analog, the filter response is identical to that produced in one iteration by the first method. This magnitude response is −6 dB in the suppression regions and 0 dB elsewhere. If some of the bands in the power spectrum are still saturated, a new pre-filter is computed by subtracting a larger fraction of the bandpass response from the impulse response. This results in a filter magnitude response of −12 dB in all suppression regions. This process is repeated, each time increasing the suppression in all saturation regions by about 6 dB over the previous filter. The process terminates when all saturation regions are below threshold. This pre-filter is used until new saturation bands are detected, or until the reconstructed spectrum indicates that a previous saturation region is no longer saturated. A new pre-filter must be designed at that time.

Figure 5:
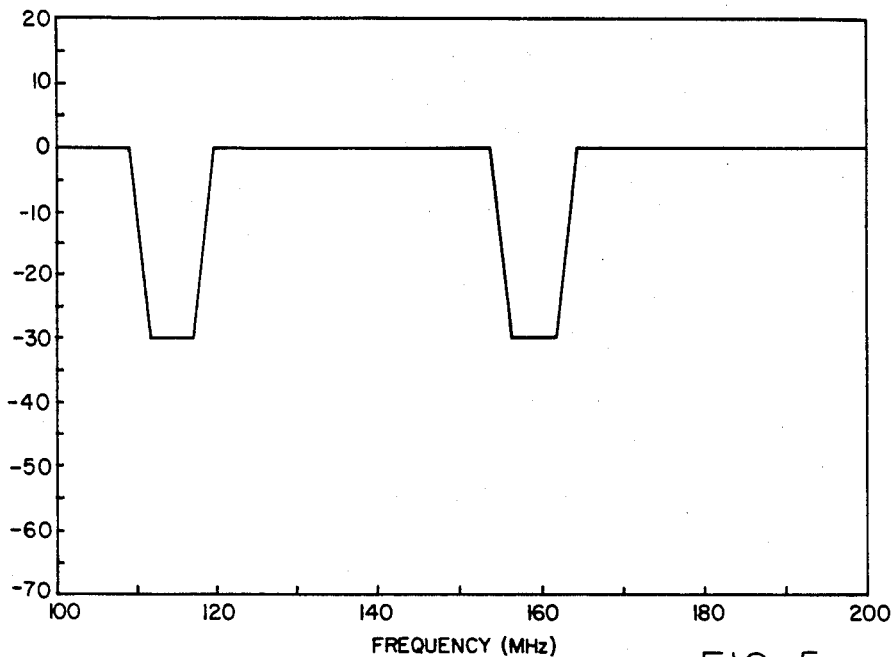
FIG. 5 is a graphic representation of another type of filter produced in accordance with the instant invention.
Figure 6:
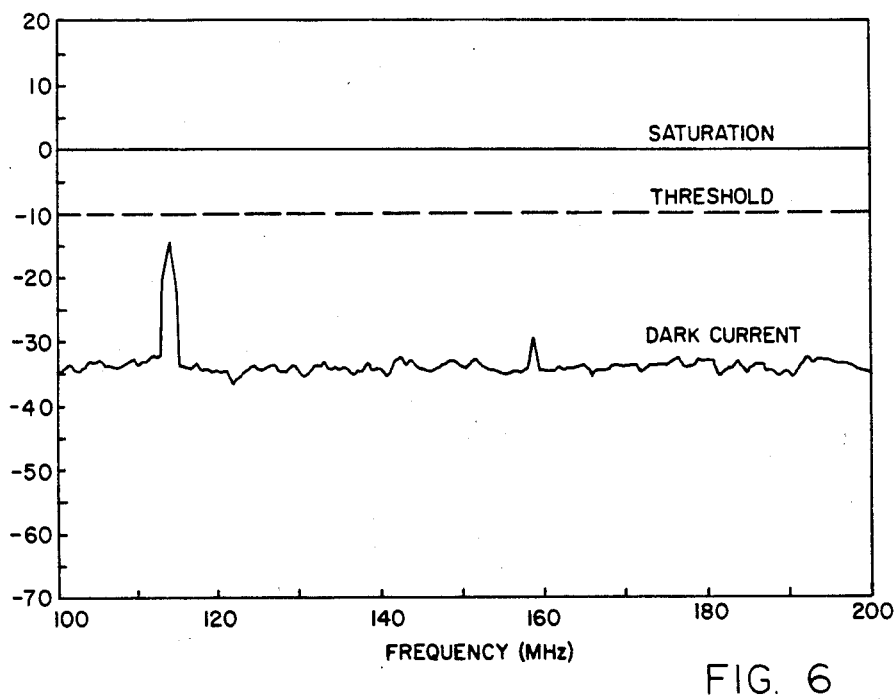
FIG. 6 is a graphic representation of the power spectrum shown in FIG. 2 after suppression by the filter shown in FIG. 5.

The disadvantage of this method is shown in FIGS. 5 and 6. That is, the input spectrum of FIG. 2 shows one frequency at 158 MHz (peak 210) marginally saturated and another at 117 MHz (peak 200) with saturation exceeding 17 dB. Using this technique of iterative filter design, both of these saturation signals are suppressed by the same amount at every stage of the pre-filter design, as shown in the filter response of FIG. 5. Thus, as seen in FIG. 6, the smaller saturation region (of peak 210) is eventually suppressed to near the bottom end of the dynamic range (i.e., to the dark current level) because of the large attenuation needed regarding peak 200. Nevertheless, this method can effectively double the dynamic range of the optical spectrum analyzer to about 60 dB. One advantage of this method is that the inverse transform is performed only once each time the filter is to be updated. This yields a significant reduction in processing time over the first method.

In an alternative application, if any one saturated frequency is detected, for example peak 200 in FIG. 2, all frequencies are attenuated by 6 dB. Obviously, this implementation is less selective. However, it requires less processing time, whereby the system operates faster. The trade-off is a less selective system that operates faster against a selective attenuation wherein the processing time increases. Which is the optimum use in a particular situation has to be separately evaluated, but either one certainly can be used.

In the iterative process, the microprocessor uses 6 dB for an arbitrary starting point, and attenuates the signal by 6 dB. The signal is sampled again. If it is still saturated, it is attenuated another 6 dB and so forth until, at some point, it is no longer saturated. This is performed by scanning all the photodetectors in the real-time, or the selective process.

In another technique a table look-up arrangement is provided. In that case a number of narrow bands are defined across the spectrum, so as to pre-define the filter. Then, if during a scan of the photodetectors a particular detector is found to be saturated, a pre-defined filter is called out of memory, and inserted into the system. The signal is attenuated by the pre-defined filter. If that filter is not sufficient, the amount of attenuation in that filter is increased and the operation is repeated.

This arrangement avoids the necessity of repeating the inverse Fourier transform which can be a time-consuming calculation. All that is required to access a look-up table and select those values that are to be used for the filter. By avoiding taking the inverse transform, the system runs faster. However, using the look-up table technique for attenuation establishes fixed filters in fixed locations. If the signal to be attenuated is a little off-center, the performance will not be as good as the custom designed filter (i.e., taking an inverse transform on each case). Thus, there is a trade-off between performance and speed. However, the very fastest possible system is the pre-designed system with a look-up table.

A third approach is referred to as a serial implementation of predesigned filters and uses predesigned filter weights stored in a Read Only Memory (ROM). Each predefined saturation region is checked serially to determine if saturation has occurred at that location. If so, the appropriate filter weights are read from ROM to implement a suppression filter for that region only. The resulting spectrum is then stored in a Random Access Memory (RAM). When all intervals of the spectrum have been checked, the actual spectrum is reconstructed by recalling the stored spectra and taking into account the known response of the filters.

This third method has the advantage of requiring no inverse transform except in the product design stage. Also, the effect of each filter is known precisely because it is designed and analyzed before implementation. This makes it possible to reconstruct the original spectrum more accurately than the methods wherein the filter design is performed in real time. The disadvantage of this approach is the amount of serial processing required to bring the entire spectrum within the dynamic range of the photodetector array.

Figure 7:
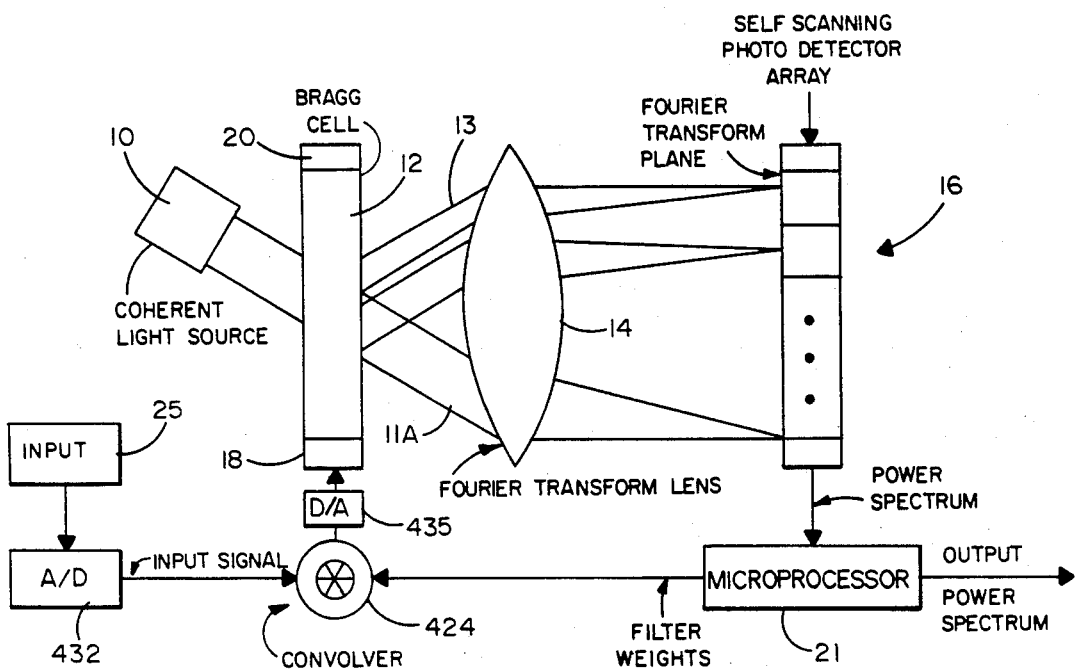
FIG. 7 is a block diagram of another embodiment of the system of the instant invention with a digital convolver.

Referring now to FIG. 7, there is shown another embodiment of the instant invention. In FIG. 7, components which are similar to components in FIG. 1 have the same reference numerals. In this embodiment, the system includes a digital convolver 424. Consequently, an analog to digital converter 432 is required to convert the input signal from input source 25 to a digital signal. Also, a D/A converter 435 is required to supply the analog signal to the Bragg cell 12. However, the D/A converter 23 is eliminated between the microprocessor 21 and the convolver 424.

However, to perform the operation in the digital domain would probably be quite difficult because of the number of operations necessary. In a large array of information, the repeated multiply and add operations required in the digital technique become very, very slow.

Thus, there are shown and described preferred embodiments of the instant invention. The novel system permits existing A/O techniques to be used with existing photodetector arrays with limited dynamic range without serious deficiencies in operation. While the embodiments described are preferred, it is clear that those skilled in the art may contemplate or devise modifications or alternatives to the invention as described. However, any such modifications or alternatives which fall within the purview of this description are intended to be included herein as well. This description is intended to be illustrative only and is not intended to be limitative of the invention. Rather, the scope of the invention is intended to be limited only by the scope of the claims appended hereto.

We claim:

1. An acousto-optic analyzer with improved dynamic range comprising,
    an acousto-optic cell,
    a photodetector array adapted to receive signals from said acousto-optic cell, and
    signal convolver means connected between said photodetector array and said acousto-optic cell and operative to alter the operation of said acousto-optic cell when said photodetector array is driven into saturation by said acousto-optic cell so that the saturation condition is terminated.

2. The analyzer recited in claim 1 wherein,
    said signal convolver means includes microprocessor means and convolver means.

3. The analyzer recited in claim 1 wherein,
    said acousto-optic cell includes Bragg cell means having the input thereof connected to said signal convolver means.

4. The analyzer recited in claim 1 wherein,
    said signal convolver is an analog signal convolver.

5. The analyzer recited in claim 1 including,
    input means connected to supply input signals to said signal convolver means.

6. The analyzer recited in claim 5 wherein,
    said input means comprises antenna means.

7. The analyzer recited in claim 2 including,
    digital to analog converter (DAC) means connected between said microprocessor means and said convolver means.

8. The analyzer recited in claim 1 wherein,
    said photodetector array comprises a self-scanning photo detector array.

9. The analyzer recited in claim 1 including,
    optical means disposed between said acousto-optical cell and said photodetector array.

10. The analyzer recited in claim 9 wherein,
    said optical means comprises a Fourier transform lens which focuses the signals from said acousto-optic cell onto said photodetector array.

11. The analyzer recited in claim 10 wherein,
    said optical means and said photodetector array are arranged so that the photodetector array is located at the Fourier transform plane of said optical means.

12. The analyzer recited in claim 2 wherein,
    said photodetector array produces electrical signals representative of the signals received from said acousto-optic cell and supplies said electrical signals to said microprocessor means.

13. The analyzer recited in claim 5 including,
    analog to digital converter (ADC) means connected between said input means and said signal convolver means.

14. The analyzer recited in claim 13 including,
    second analog to digital converter (ADC) means connected between said signal convolver means and said acousto-optic cell.

15. The analyzer recited in claim 1 including,
    source means for supplying a coherent light beam to said acousto-optic cell.

16. The analyzer recited in claim 2 wherein,
    said microprocessor means is operative to produce a least one of a Fast Fourier Transform (FFT) and a Hamming function.

17. The analyzer recited in claim 2 including,
    input means connected to supply input signals to said convolver means, and
    said microprocessor supplies filter signals to said convolver means to suppress at least a selected portion of said input signals.

18. A method of optical adaptive filtering comprising the steps of:

supplying a coherent light beam to an acousto-optic cell, supplying control signals to said acousto-optic cell to selectively control the light beam which passes through the acousto-optic cell, detecting the light beam which has passed through the acousto-optic cell and producing signals indicative of certain amplitude levels of the light beam which has passed through the acousto-optic cell, producing filter signals which are determined by the signals indicative of the certain amplitude levels of the light beam, and convolving said filter signals with said control signals to alter said control signals whereby the light beam which passes through said acousto-optic cell is altered so that the signals indicative of certain amplitude levels of the light beam are eliminated.

19. The method recited in claim 18 wherein,
said filter signals are produced so as to be uniform wherein said convolving step alters said control signal uniformly.

20. The method recited in claim 16 wherein, said filter signals are produced selectively wherein said convolving step alters selected portions of said control signals.

21. The method recited in claim 18 wherein,
said filter signals are produced iteratively until said signals indicative of certain amplitude levels of the light beam are eliminated.

22. An optical adaptive filter comprising,
source means for supplying a coherent light beam,
acousto-optic cell means arranged to receive and operate upon said coherent light beam,
lens means arranged to receive and focus said light beam after it has been operated upon by said acousto-optic cell means,
photodetector means arranged to receive the focused light beams from said lens means, and
signal convolver means connected between said photodetector means and said acousto-optic cell in order to supply a signal to said acousto-optic cell to alter the operation thereof as a function of the operation of said photodetector means.

* * * * *